United States Patent
Terzioglu et al.

(10) Patent No.: US 9,082,481 B2
(45) Date of Patent: Jul. 14, 2015

(54) STATIC NAND CELL FOR TERNARY CONTENT ADDRESSABLE MEMORY (TCAM)

(71) Applicant: QUALCOMM Incorporated, San Diego, CA (US)

(72) Inventors: Esin Terzioglu, San Diego, CA (US); Nishith Desai, San Diego, CA (US); Rakesh Vattikonda, San Diego, CA (US); ChangHo Jung, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/503,861

(22) Filed: Oct. 1, 2014

(65) Prior Publication Data
US 2015/0085554 A1      Mar. 26, 2015

Related U.S. Application Data

(62) Division of application No. 13/730,524, filed on Dec. 28, 2012.

(51) Int. Cl.
 *G11C 15/04* (2006.01)
 *G11C 15/00* (2006.01)

(52) U.S. Cl.
 CPC .............. *G11C 15/04* (2013.01); *G11C 15/00* (2013.01); *G11C 15/043* (2013.01); *G11C 15/046* (2013.01)

(58) Field of Classification Search
 CPC ...... G11C 15/04; G11C 15/00; G11C 15/046; G11C 15/043; G11C 17/30982
 USPC .................... 365/49.1, 120, 189.11
 See application file for complete search history.

(56) References Cited

U.S. PATENT DOCUMENTS

| 6,044,005 A | 3/2000 | Gibson et al. |
| 6,385,070 B1 | 5/2002 | Peterson |

(Continued)

FOREIGN PATENT DOCUMENTS

| TW | 525186 B | 3/2003 |
| TW | 1260636 B | 8/2006 |

(Continued)

OTHER PUBLICATIONS

Chang, et al., "A low-power TCAM design using mask-aware match-line (MAML) technique", GLSVLSI'11: Proceedings of the 21st edition of the great lakes symposium on Great lakes symposium on VLSI, May 2011, 6 pgs.

(Continued)

*Primary Examiner* — Jason Lappas
(74) *Attorney, Agent, or Firm* — Paul S. Holdaway

(57) ABSTRACT

A static, ternary content addressable memory (TCAM) includes a key cell and a mask cell coupled to intermediate match lines. The key cell is coupled to a first pull-down transistor and a first pull-up transistor. The mask cell is coupled to a second pull-down transistor and a second pull-up transistor. The first pull-down transistor and second pull-down transistor are connected in parallel and the first pull-up transistor and second pull-up transistor are connected in series. A match line output is also coupled to the first pull-down transistor and second pull-down transistor and further coupled to the first pull-up transistor and second pull-up transistor.

6 Claims, 8 Drawing Sheets

(56) References Cited

U.S. PATENT DOCUMENTS

| | | |
|---|---|---|
| 6,400,593 B1 * | 6/2002 | Lien et al. .................. 365/49.12 |
| 6,411,538 B1 | 6/2002 | Kengeri |
| 6,574,702 B2 | 6/2003 | Khanna et al. |
| 6,760,242 B1 | 7/2004 | Park et al. |
| 6,775,168 B1 | 8/2004 | Park et al. |
| 7,050,318 B1 | 5/2006 | Argyres |
| 7,110,275 B2 | 9/2006 | Park |
| 7,154,764 B2 | 12/2006 | Nataraj |
| 7,286,379 B1 | 10/2007 | Sun |
| 7,355,890 B1 | 4/2008 | Wen |
| 7,555,594 B2 | 6/2009 | Venkatachary |
| 7,940,541 B2 | 5/2011 | Ali et al. |
| 8,125,810 B2 | 2/2012 | Bosshart |
| 8,169,808 B2 | 5/2012 | Roohparvar |
| 8,582,338 B1 | 11/2013 | Argyres |
| 2005/0276086 A1 | 12/2005 | Perry et al. |
| 2009/0141580 A1 | 6/2009 | Evans et al. |
| 2009/0310395 A1 | 12/2009 | Chiang |
| 2012/0063189 A1 | 3/2012 | Maurya et al. |
| 2014/0177310 A1 | 6/2014 | Vattikonda et al. |
| 2014/0185348 A1 | 7/2014 | Vattikonda et al. |
| 2014/0185349 A1 | 7/2014 | Terzioglu et al. |

FOREIGN PATENT DOCUMENTS

| | | |
|---|---|---|
| TW | 1302706 B | 11/2008 |
| TW | 201013694 A | 4/2010 |
| TW | 201117213 A | 5/2011 |
| WO | WO-03056565 A1 | 7/2003 |

OTHER PUBLICATIONS

Huang, et al., "Energy-Efficient Design for Ternary Content Addressable Memory", International Journal of Electrical Engineering, v 15, n. 2, ISSN:18123031, Apr. 2008, p. 97-108.

International Search Report and Written Opinion—PCT/US2013/076835—ISAEPO—Apr. 4, 2014.

International Search Report and Written Opinion—PCT/US2013/076848—ISAEPO—Apr. 4, 2014.

International Search Report and Written Opinion—PCT/US2013/076853—ISAEPO—Apr. 22, 2014.

Matsunaga, et al., "Design of a Low-Energy Nonvolatile Fully-Parallel Ternary CAM Using a Two-Level Segmented Match-Line Scheme", 41st IEEE International Symposium on Multiple-Valued Logic, 2011, pp. 99-104.

Pagiamtzis K., et al., "Content-Addressable Memory (CAM) Circuits and Architectures: A Tutorial and Survey," IEEE Journal of Solid-State Circuits, vol. 41, No. 3 Mar. 2006, pp. 712-727.

Wang J.S., et al., "Design trend of energy-efficient CAMs," SoC Design Conference, 2008, ISOCC '08, International, IEEE, Piscataway, NJ, USA, Nov. 24, 2008, pp. I-21-I-24,XP031449435, ISBN: 978-1-4244-2598-3.

* cited by examiner

STATIC NAND CELL FOR TERNARY CONTENT ADDRESSABLE MEMORY (TCAM)

TECHNICAL FIELD

The present Application for Patent is a divisional of patent application Ser. No. 13/730,524, entitled "STATIC NAND CELL FOR TERNARY CONTENT ADDRESSABLE MEMORY (TCAM)" filed Dec. 28, 2012, which is assigned to the assignee hereof and hereby expressly incorporated by reference herein.

BACKGROUND

TCAMs are typically used in routers and Ethernet switches for Internet protocol (IP) address forwarding. The storage elements are typically designed using a dynamic NOR/NAND type cell.

Content addressable memory (CAM) supports a read operation, write operation, and compare operation. A compare bus of the same width (e.g., bits per word) as an entry in the CAM is input at a clock edge. The data of the compare bus is simultaneously compared to every entry in the CAM. That is, the comparison occurs parallel so the bus may be compared to every entry in the CAM during one clock cycle. An entry is a match when every bit in an entry matches the corresponding bit in the compare bus. Alternatively, an entry is a mismatch when any bit in an entry does not match the corresponding bit in the compare bus. The bits of the entries in the CAM are either 0 or 1.

A TCAM is similar to CAM with the addition of a mask value that may be stored in a cell. The mask value may be referred to as a local mask. A mask value is not compared with a compare bit, and therefore, the compare result will always be a match.

FIG. 1 illustrates an architecture of a conventional TCAM 100. As illustrated in FIG. 1, a search word, such as "1101," is input to a register 150 of the TCAM 100. The search word is compared to the value stored in the TCAM cells 110. TCAMs typically have sixteen TCAM cells per stage. The search is simultaneously conducted across the TCAM cells 110. The content of the TCAM cells 110 may be a high bit (1), a low bit (0), or a mask value (X). Prior to the search, a match line 130-136 for each set of TCAM cells 120-126 is set to high. The match lines 130-136 are input to a priority encoder 140. The TCAM 100 outputs (MLout) the address of the set of TCAM cells that match the search word line. Because the search is a parallel search, the search may be completed in one clock cycle. It should be noted that a mask value may be a 0 or 1, still, in the present disclosure, the mask value may be referred to as an X.

As an example, as illustrated in FIG. 1, a first set of TCAM cells 120 is set to "1 X 0 1," a second set of TCAM cells 122 is set to "1 0 X 1," a third set of TCAM cells 124 is set to "1 1 X X," and a fourth set of TCAM cells 126 is set to "1 X 1 X." When comparing the content of the TCAM cells to the search bit, when the content of the TCAM cell is a mask value X, the comparison will yield a match. Thus, according to the example illustrated in FIG. 1, the first set of TCAM cells 120 and the third set of TCAM cells 124 match the search word in the register 150. Accordingly, the match lines 130 134 of the first set of TCAM cells 120 and the third set of TCAM cells 124 will indicate a match and the priority encoder 140 outputs the address of the first set of TCAM cells 120 and the third set of TCAM cells 124.

The conventional TCAM architecture is a dynamic circuit and has a high dynamic power dissipation. In some cases, the TCAM may have a dynamic NAND architecture. In other cases, the TCAM may have a dynamic NOR architecture.

In a dynamic NOR TCAM architecture, match lines are pre-charged high and evaluate low to indicate a mismatch. The majority of comparisons yield a mismatch, and therefore, the dynamic NOR has an increased power consumption as a result of switching from high to low for indicating a mismatch. Furthermore, the dynamic NOR has a complex timing control because the pre-charge signal is used by each match line in each clock cycle.

FIG. 2 illustrates a conventional dynamic NOR TCAM 200. As illustrated in FIG. 2, the dynamic NOR TCAM 200 includes key cells $Key_0$-$Key_{n-1}$ and mask cells $Mask_0$-$Mask_{n-1}$. Typically, a NOR TCAM, such as the NOR TCAM 200 of FIG. 2, may have sixteen key and mask cells. Data is input via search lines ($SL_0$-$SL_{n-1}$ and $SL_0\#$-$SL_{n-1}\#$). The data is compared to the values stored in the key cells $Key_0$-$Key_{n-1}$ and mask cells $Mask_0$-$Mask_{n-1}$. The match line $ML_{NOR}$ is pre-charged high via the pre-charge line PRE# from a pull-up transistor 202. The match line $ML_{NOR}$ will evaluate low when there is a mismatch between the data input via one of the search lines ($SL_0$-$SL_{n-1}$ and $SL_0\#$-$SL_{n-1}\#$) and the data stored in one of the cells $Key_0$-$Key_{n-1}$ $Mask_0$-$Mask_{n-1}$. The match line remains high when the values of all of the cells $Key_0$-$Key_{n-1}$ $Mask_0$-$Mask_{n-1}$ match the input data.

The structure of the key cells $Key_0$-$Key_{n-1}$ is illustrated in the expanded key cell 220 and the structure of the mask cells $Mask_0$-$Mask_{n-1}$ is illustrated in the expanded mask cell 222. As illustrated in the expanded key cell 220, the key cells $Key_0$-$Key_{n-1}$ are implemented via an SRAM cell. During a compare operation, the key bar K# is ANDed with the search line SL. The key cells $Key_0$-$Key_{n-1}$ include a bit line BLK, a bit line bar BLK#, and a word line WLK.

As illustrated in the expanded mask cell 222, the mask cells $Mask_0$-$Mask_{n-1}$ are implemented via a SRAM cell. During a comparison operation, the mask bar M# is ANDed with the search line bar SL#. The mask cells $Mask_0$-$Mask_{n-1}$ include a bit line BLM, a bit line bar BLM#, and a word line WLM.

TABLE 1 is a truth table for the dynamic NOR TCAM. TABLE 1 shows the value of the match line based on the values of the mask cells (M), key cells (K), and the search lines (SL and SL#). It should be noted that the state refers to the state of a storage element (key cell and mask cell). The state is 0 when the key bit has a value of 0, the state is 1 when the key bit has a value of 1, and the state is X when both the mask bit and the key bit are 1. The state of X refers to a mask state in which there is neither a match nor a mismatch, rather, there is no comparison between the value of the search line and the values of the mask cell and key cell. Thus, the match line always indicates a match.

TABLE 1

| State | Mask Bit (M) | Key Bit (K) | Search Line (SL) | Search Line Bar (SL#) | Match Line ($ML_{NOR}$) |
|---|---|---|---|---|---|
| 0 | 1 | 0 | 0 | 1 | 1 |
| 0 | 1 | 0 | 1 | 0 | 0 |
| 1 | 0 | 1 | 0 | 1 | 0 |
| 1 | 0 | 1 | 1 | 0 | 1 |
| X | 1 | 1 | X | X | 1 |
| — | 0 | 0 | — | — | Not Allowed |

As shown in TABLE 1, the match line will be 0 (low) and indicate a mismatch when the key bit and search line have different values. Likewise, the match line will be 0 and indicate a mismatch when both the mask bit and search line bar have different values. That is, when the key bit is 0 (e.g., key bit bar (K#) is 1) and the search line is 1 or when the mask bit is 0 (e.g., mask bit bar (M#) is 1) and the search line bar is 1, a pull down transistor will be activated to pull the match line to low. Moreover, the match line will be 1 (high) and indicate a match when the key bit and search line have the same values. Likewise, the match line will be 1 and indicate a match when both the mask bit and search line bar have the same values. Furthermore, when both the mask bit and key bit are 1, the state is X. That is, the match line will remain high and indicate a match regardless of the value of the search line.

As discussed above, in a dynamic NOR TCAM, the match lines and search lines are pre-charged high at the beginning of every cycle and the match lines evaluate low to indicate a mismatch. The majority of comparisons of the cells in a TCAM yield a mismatch. Thus, the power consumption of the dynamic NOR TCAM is increased as a result of the switching from high to low when indicating a mismatch. In some cases, match lines may be pre-discharged low to reduce the power consumption. Still, even when then match lines are pre-discharged, a pre-charge operation charges the match line at the beginning of every cycle. Accordingly, the pre-charging of the match line leads to an increase in power consumption and additionally control circuitry.

In a dynamic NAND TCAM architecture, the match lines are pre-charged high and evaluate low to indicate a match. That is, a pre-charge signal is used for each match line during every cycle to set the match lines to high. Depending on the status of the mask cell or key cell, the match line may be pulled low or remain high. Each intermediate match line is associated with a mask cell and a key cell. Furthermore, each key cell further includes XNOR logic. The dynamic NAND TCAM uses a serial operation. Thus, an intermediate match line (n−1) may discharge (e.g., compare with the value of the search line) when the previous intermediate match line (n−2) was pulled low to indicate a match. That is, the operation continues from one intermediate match line (n−2) to a subsequent intermediate match line (n−1) when there is a match and stops progressing through the intermediate match lines when there is a mismatch.

The power consumption of the conventional dynamic NAND TCAM during a match line evaluation may be less than the power consumption of the conventional dynamic NOR TCAM because of the serial operation. Still, the conventional dynamic NAND TCAM may be undesirable because of errors resulting from charge-sharing.

FIG. 3 illustrates a conventional dynamic NAND TCAM 300. As illustrated in FIG. 3, the dynamic NAND architecture 300 includes a match line output $ML_{NAND}$ charged by a pre-charge line PRE# from a pull-up transistor 310. The match line output $ML_{NAND}$ is connected to a series of intermediate match lines $ML_0$-$ML_{n-1}$. Each of the intermediate match lines $ML_0$-$ML_{n-1}$ is coupled to a mask cell $Mask_0$-$Mask_{n-1}$ and a key cell $Key_0$-$Key_{n-1}$ via transistors connected in parallel (e.g., transmission gate). The transistors connected in parallel include a key NMOS transistor 303 coupled to a key cell $Key_0$-$Key_{n-1}$ and a mask NMOS transistor 304 coupled to a mask cell $Mask_0$-$Mask_{n-1}$.

The content of the mask cells $Mask_0$-$Mask_{n-1}$ is illustrated in an expanded mask cell 333. As shown in the expanded mask cell 333, mask cells $Mask_0$-$Mask_{n-1}$ are SRAM cells including a mask value M, a mask value bar M#, a mask word line WLM, a mask bit line BLM, and a mask bit line bar BLM#. The content of the key cells $Key_0$-$Key_{n-1}$ is illustrated in an expanded key cell 330. As shown in the expanded key cell 330, the key cells $Key_0$-$Key_{n-1}$ are SRAM cells with XNOR logic. The key cells $Key_0$-$Key_{n-1}$ further include a search line SL, a search line bar SL#, a key bit line BLK, a key bit line bar BLK#, a key value K, a key bar value K#, a key write line WLK, and an output line XNOR.

TABLE 2

| State | Mask Bit (M) | Key Bit (K) | Search Line (SL) | XNOR | $ML_i \rightarrow ML_{i+1}$ Propagation | $ML_{NAND}$ |
|---|---|---|---|---|---|---|
| 0 | 1 | 0 | 0 | 1 | ON | 0/1 |
| 0 | 1 | 0 | 1 | 0 | OFF | Floating |
| 1 | 1 | 1 | 0 | 0 | OFF | Floating |
| 1 | 1 | 1 | 1 | 1 | ON | 0/1 |
| X | 0 | X | X | X | ON | 0/1 |

In a dynamic NAND TCAM architecture, the $ML_{NAND}$ is pre-charged high and evaluates low to indicate a match. Depending on the status of the mask cell or key cell, the $ML_{NAND}$ may be pulled low or remain high. Each intermediate match line ($ML_0$-$ML_{n-1}$) is associated with a mask cell and a key cell. The dynamic NAND TCAM uses a serial operation, therefore, an intermediate match line $ML_i$ may be pulled low (depending on the values of the Key and Mask cells) if the previous intermediate match line $ML_{i-1}$ indicates a match. That is, a zero (low intermediate match line) propagates from one intermediate match line $ML_i$ to a subsequent intermediate match line $ML_{i+1}$ when there is a match. Furthermore, the zero stops progressing through the intermediate match lines when there is a mismatch. Accordingly, the propagation of a zero from a current intermediate match line $ML_i$ to a subsequent intermediate match line $ML_{i+1}$ also specifies that all of the previous match lines indicated a match.

Because the intermediate match lines are serially connected, the state of the match line output $ML_{NAND}$ is unknown until all the intermediate match lines are evaluated or until a mismatch is determined. Therefore, as shown in TABLE 2, the match line output $ML_{NAND}$ will be either 0/1 when a mismatch has not yet been determined.

When a current intermediate match line $ML_i$ evaluates low to indicate a match, the dynamic NAND TCAM propagates this low value from the current intermediate match line $ML_i$ to a subsequent intermediate match line $ML_{i+1}$. The propagation from the current intermediate match line $ML_i$ to a subsequent intermediate $ML_A$ is shown as the ON switch in TABLE 2. Furthermore, the match line output $ML_{NAND}$ is either 0/1, because a mismatch has not yet been determined.

When a current intermediate match line $ML_i$ remains high to indicate a mismatch, the dynamic NAND TCAM does not propagate from the current intermediate match line $ML_i$ to a subsequent intermediate $ML_{i+1}$. Thus, TABLE 2 indicates the propagation as OFF when a current intermediate match line $ML_i$ indicates a mismatch. More specifically, the operations of subsequent intermediate match lines stop when the current intermediate match line indicates a mismatch.

In TABLE 2 the value for XNOR represents the value of the output from key cell. A mismatch is indicated when the XNOR is 0. The current intermediate match line, such as $ML_i$, remains high because of the mismatch. A match is indicated when the XNOR is 1, and the current intermediate match line, such as MLi, is pulled low when there is a match (if intermediate match lines to the left of the current intermediate match line have also been pulled low). Finally, in TABLE 2, the state refers to the state of a storage element (key cell and mask cell). The state is 0 when the key cell has a value of 0; the state is 1 when the key cell has a value of 1; and the state is X when the mask cell is 0. That is, for the state of X, when the mask cell is 0, the mask NMOS transistor 304 is enabled regardless of the XNOR value. More specifically, the state of X refers to a mask state in which there is neither a match nor a mismatch, rather, there is no comparison between the value of the search line and the values key cell.

In some cases, a conventional dynamic NAND TCAM with a deep NMOS stack may fail due to charge sharing. FIG. 4 illustrates an example of a dynamic NAND with a deep NMOS stack. During a pre-charge cycle all intermediate match line junction capacitances $C_{J0}$-$C_{J3}$ may be discharged to low. During an evaluate cycle, $ML_{NAND}$ is pre-charged high and the dynamic node capacitance $C_{ML}$ is exposed to one or more of the intermediate match line junction capacitances $C_J$ and shares the charge with the one or more intermediate match line junction capacitances $C_J$. As a result of the charge sharing, the voltage level of the match line output $ML_{NAND}$ may fall below a threshold voltage of the next inverter and trigger a false operation.

The speed of a TCAM may increase with an increase in the depth of an NMOS stack. Still, the speed of the dynamic NAND is limited due to the aforementioned charge sharing failure. Accordingly, the dynamic NOR TCAM may perform at speeds greater than the speed of a dynamic NAND TCAM. In some cases, to mitigate failure resulting from charge sharing, the intermediate junction capacitances $C_J$ may be pre-charged to a $V_{DD}$-$V_t$ voltage level, where $V_{DD}$ is a supply level and $V_t$ is a threshold voltage. Still, pre-charging the intermediate junction capacitances may not be desirable due to an increased area and additional timing complexity. In other cases, to mitigate failure resulting from charge sharing, the search line may be dynamic and pre-charged high every cycle to propagate a $V_{DD}$-$V_t$ voltage level through the NMOS stack. Nonetheless, pre-charging the search line may not be desirable because it is a dynamic power solution and results in an increased delay.

SUMMARY

According to an aspect of the present disclosure, a static ternary content addressable memory (TCAM) is presented. The static TCAM includes a key cell coupled to a first pull-down transistor and a first pull-up transistor. The static TCAM also includes a mask cell coupled to a second pull-down transistor and a second pull-up transistor. The first pull-down transistor and the second pull-down transistor are connected in parallel, and the first pull-up transistor and the second pull-up transistor are connected in series. The static TCAM further includes a match line output coupled to the first pull-down transistor and the second pull-down transistor and further coupled to the first pull-up transistor and the second pull-up transistor.

According to another aspect of the present disclosure, a method within a static TCAM is presented. The method includes receiving an output of a key cell at a first pull-down transistor and a first pull-up transistor. The method also includes receiving an output of a mask cell at a second pull-down transistor and a second pull-up transistor. The first pull-down transistor and the second pull-down transistor are connected in parallel, and the first pull-up transistor and the second pull-up transistor are connected in series. The method further includes setting a match line output based at least in part on the output of the key cell and the output of the mask cell.

According to still another aspect, a static TCAM is presented. The static TCAM includes a first means for comparing a search value coupled to a first pull-down transistor and a first pull-up transistor. The static TCAM also includes a second means for comparing the search value coupled to a second pull-down transistor and a second pull-up transistor. The first pull-down transistor and the second pull-down transistor are connected in parallel, and the first pull-up transistor and the second pull-up transistor are connected in series. The static TCAM further includes a match line output coupled to the first pull-down transistor and the second pull-down transistor and further coupled to the first pull-up transistor and the second pull-up transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Aspects of the present disclosure provide a static NAND TCAM that does not pre-charge the match line and reduces the complexity of the timing control circuitry. According to the present disclosure, the static NAND TCAM does not use complex timing control circuitry for a match line pre-charge because the match line (ML) is not pre-charged before each cycle. The match line includes the intermediate match lines $ML_0$-$ML_{n-1}$ and the match line output $ML_{NAND}$. Furthermore, the static implementation reduces the possibility of charge sharing problems.

Figure 5:
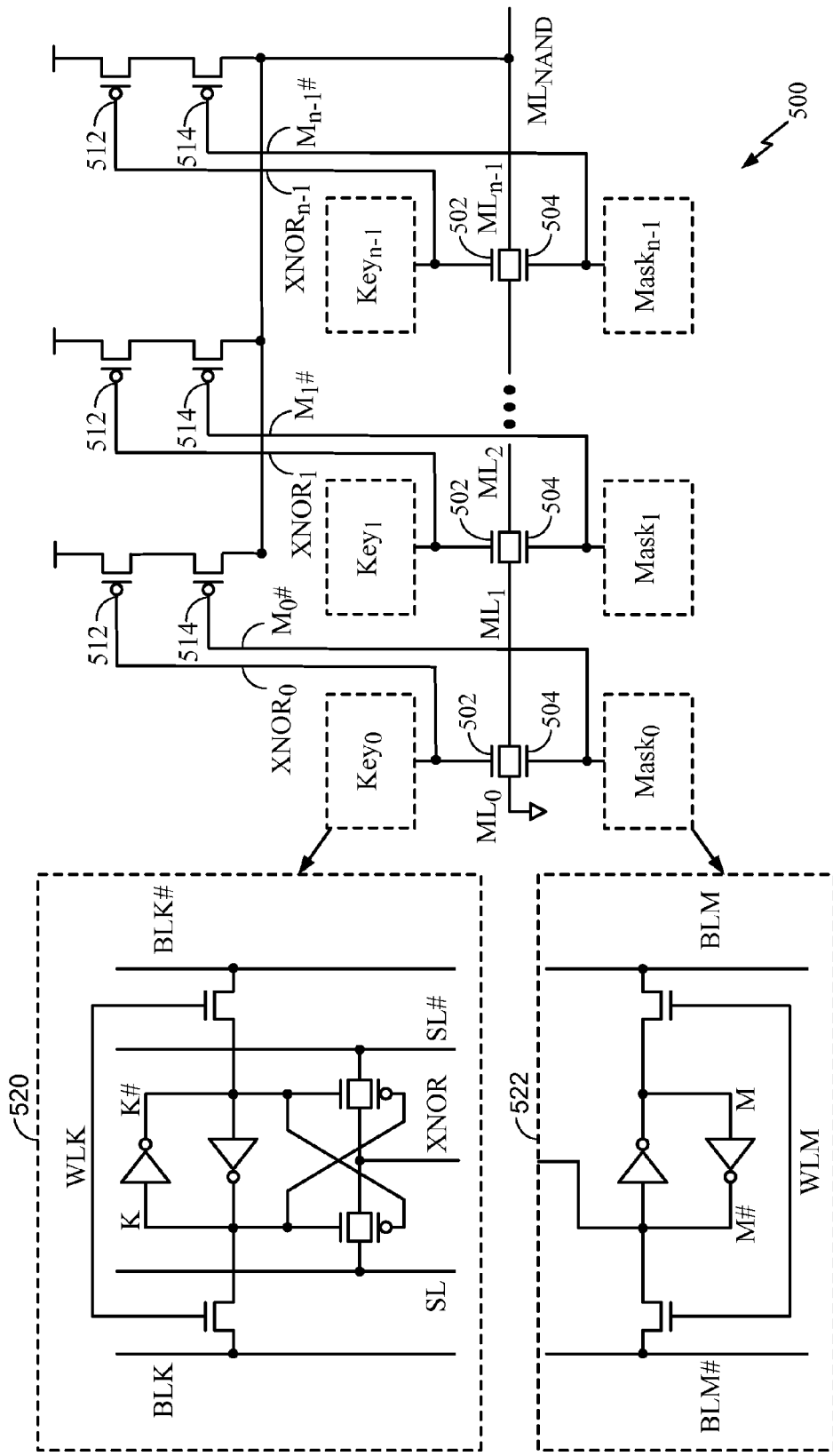
FIG. 5 illustrates a static NAND architecture according to an aspect of the present disclosure.

FIG. 5 illustrates an architecture of a static NAND TCAM 500 according to an aspect of the present disclosure. As illustrated in FIG. 5, a match line output $ML_{NAND}$ is connected to a series of intermediate match lines $ML_0$-$ML_{n-1}$. Each of the intermediate match lines $ML_0$-$ML_{n-1}$ is coupled to a mask cell $Mask_0$-$Mask_{n-1}$ via a first pull-down transistor, such as mask NMOS transistor 504, and a key cell $Key_0$-$Key_{n-1}$ via a second pull-down transistor, such as key NMOS transistor 502. The pull-down transistors are connected in parallel. The content of the mask cells $Mask_0$-$Mask_{n-1}$ is illustrated in an expanded mask cell 522. As shown in the expanded mask cell 522, the mask cells $Mask_0$-$Mask_{n-1}$ are SRAM cells including a mask bit M, a mask bit bar M#, a mask word line WLM, a mask bit line BLM, and a mask bit line bar BLM#. The content of the key cells $Key_0$-$Key_{n-1}$ is illustrated in an expanded key bit cell 520. As shown in the expanded key bit cell 520, the key cells $Key_0$-$Key_{n-1}$ are SRAM cells with XNOR logic. The key cells $Key_0$-$Key_{n-1}$ further include a search line SL, a search line bar SL#, a key bit line BLK, a key bit line bar BLK#, a key bit K, a key bit bar K#, a key write line WLK, and an output line XNOR.

Furthermore, each of the key cells $Key_0$-$Key_{n-1}$ is coupled to a first PMOS transistor 512 and each of the mask cells $Mask_0$-$Mask_{n-1}$ is coupled to a second PMOS transistor 514. Each first PMOS transistor 512 is coupled to a respective key cell $Key_0$-$Key_{n-1}$ via an XNOR line ($XNOR_0$-$XNOR_{n-1}$), and each second PMOS transistor 514 is coupled to a respective mask cell $Mask_0$-$Mask_{n-1}$ via a mask bit line bar ($M_0\#$-$M_{n-1}\#$). The first PMOS transistor 512 and second PMOS transistor 514 are also coupled to the match line output ($ML_{NAND}$). The first PMOS transistor 512 and second PMOS transistor 514 are connected in series and may be referred to as a serial PMOS transistors. Thus, according to an aspect of the present disclosure, each cell pair (e.g., one mask cell and one key cell) is coupled to parallel NMOS transistors (e.g., key NMOS transistor 502 and mask NMOS transistor 504) and serial PMOS transistors (e.g., first PMOS transistor 512 and second PMOS transistor 514).

Figure 1:
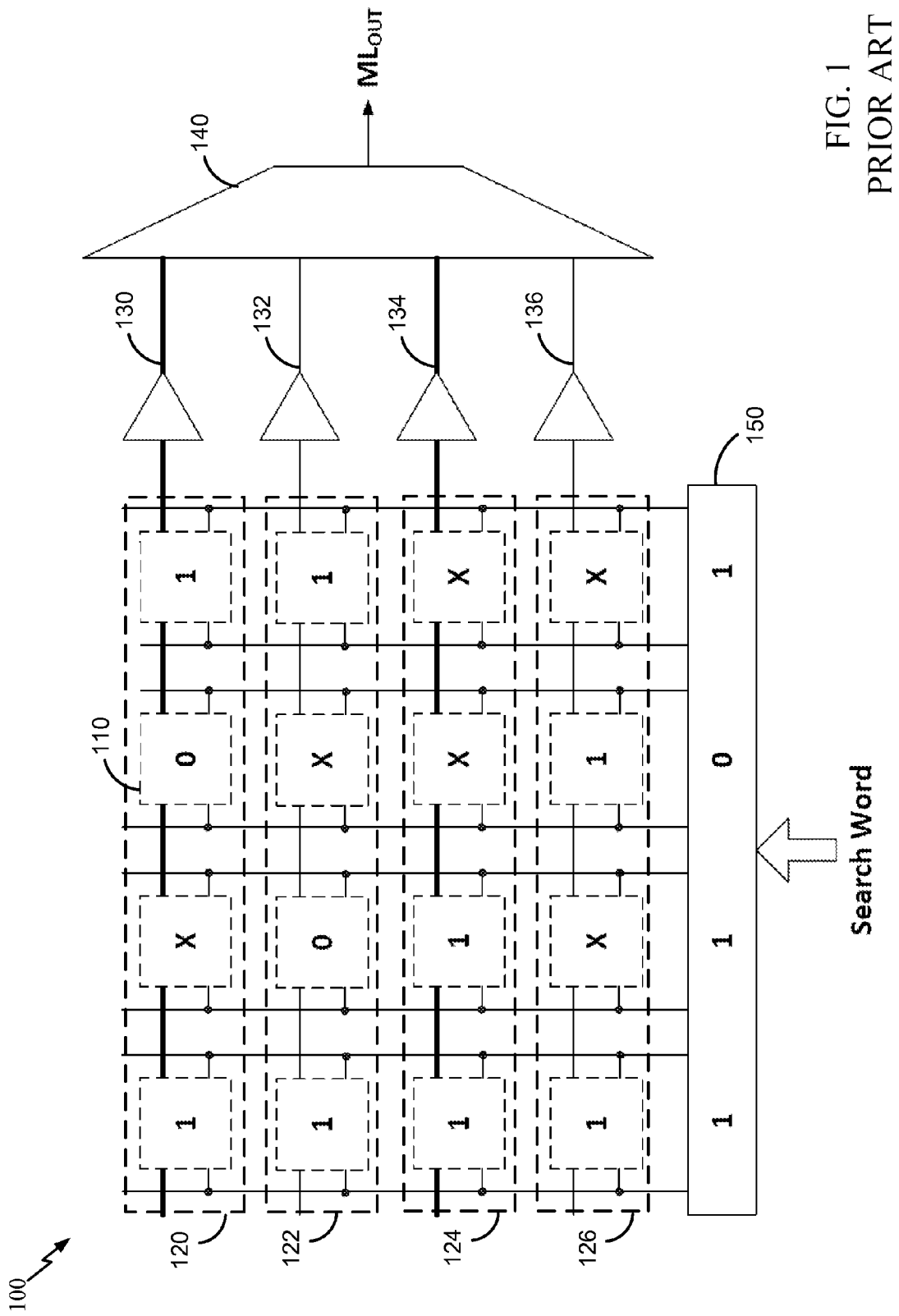
FIG. 1 illustrates a TCAM memory system.
Figure 2:
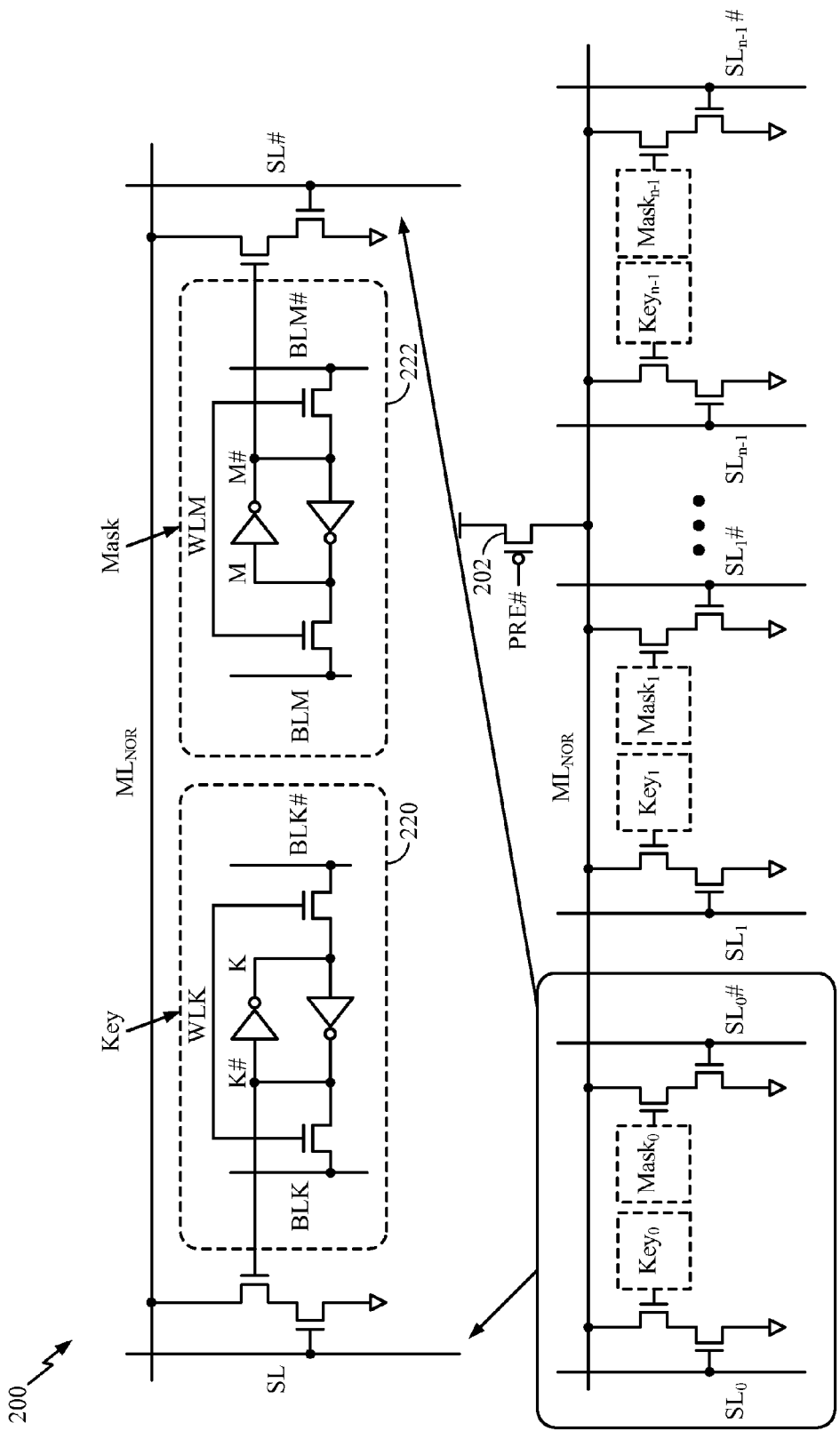
FIG. 2 illustrates a prior art dynamic NOR architecture.
Figure 3:
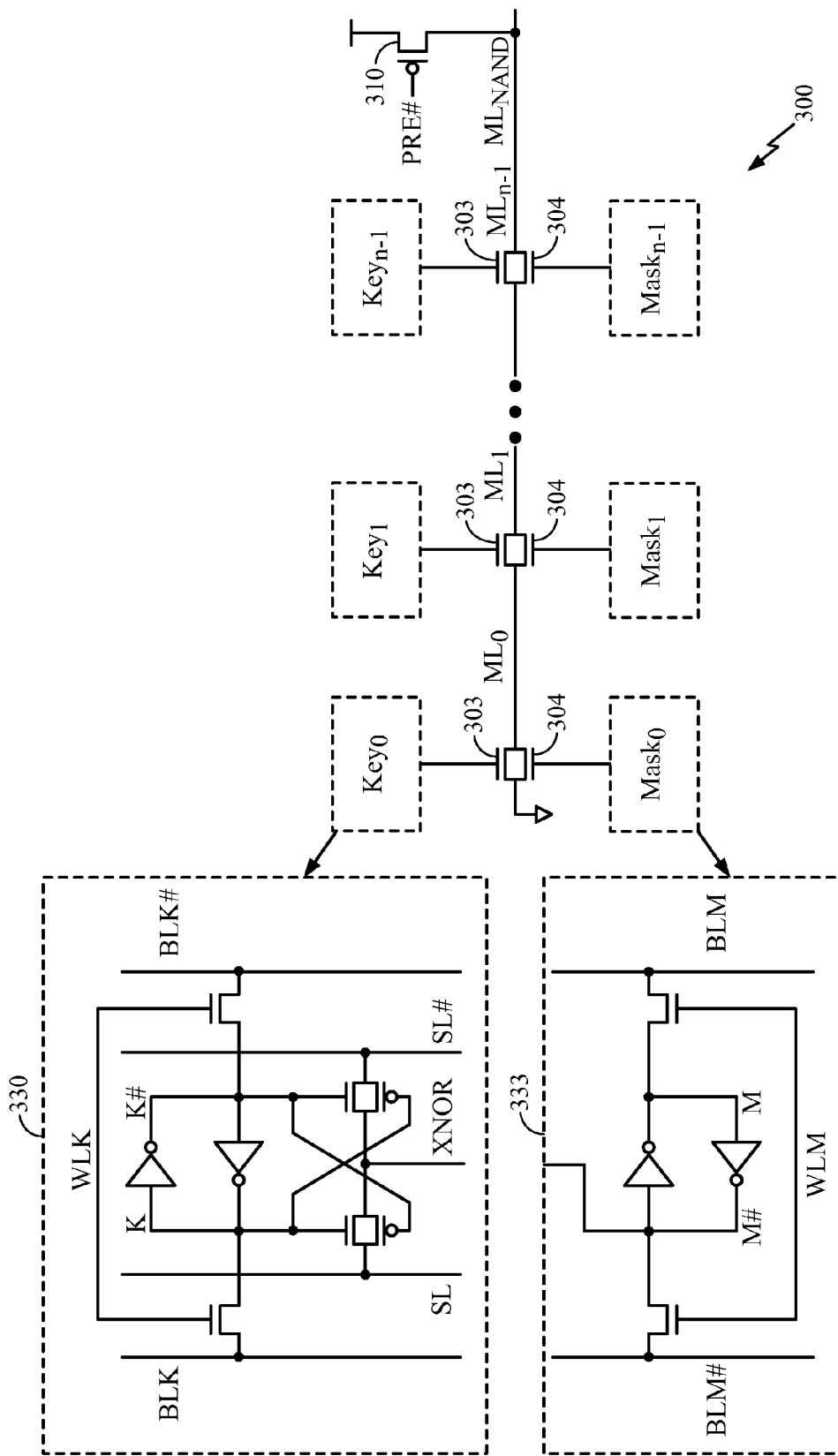
FIGS. 3-4 illustrate a prior art dynamic NAND architecture.
Figure 4:
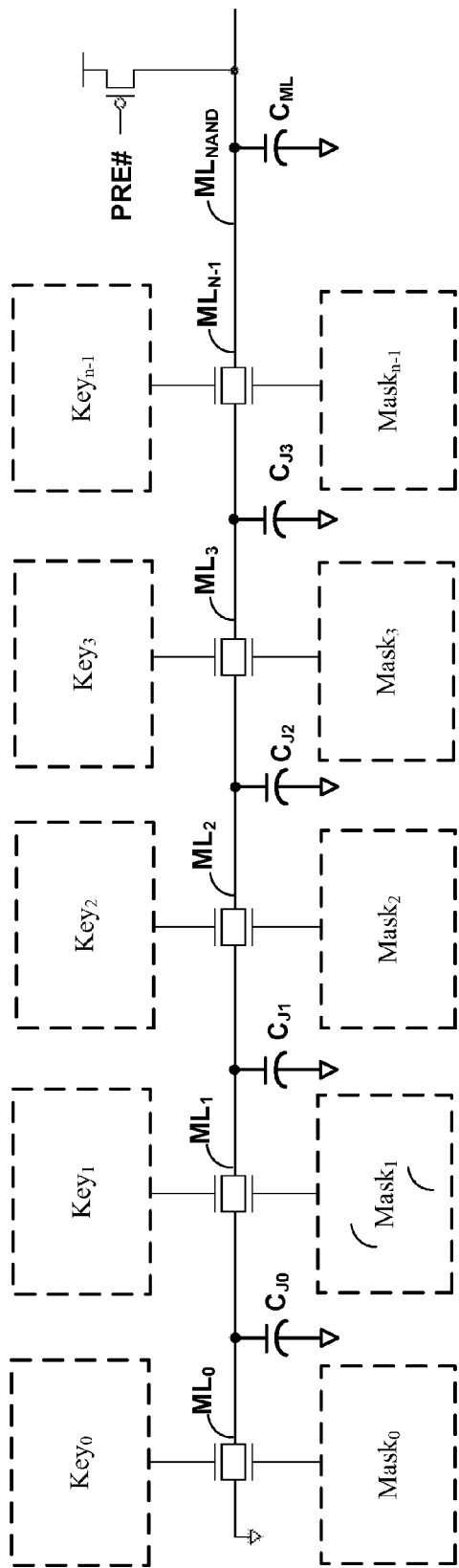

Because the first PMOS transistor 512 and second PMOS transistor 514 are coupled to each cell pair, the match line is not pre-charged before each clock cycle. Therefore, the static NAND TCAM 500 does not use a complex timing control scheme and saves more power in comparison to a dynamic NAND TCAM (FIG. 3). Moreover, the intermediate match lines are not pre-charged to a $V_{DD}$-$V_t$ voltage level, thereby providing a decrease in area and a decrease in power consumption for the search line.

TABLE 3 shows a truth table for the static NAND according to an aspect of the present disclosure.

TABLE 3

| State | Mask Bit (M) | Key Bit (K) | Search Line (SL) | XNOR | $ML_i \rightarrow ML_{i+1}$ Propagation | $ML_{NAND}$ |
|---|---|---|---|---|---|---|
| 0 | 1 | 0 | 0 | 1 | ON | 0/1 |
| 0 | 1 | 0 | 1 | 0 | OFF | 1 |
| 1 | 1 | 1 | 0 | 0 | OFF | 1 |
| 1 | 1 | 1 | 1 | 1 | ON | 0/1 |
| X | 0 | X | X | X | ON | 0/1 |

As previously discussed, the static NAND TCAM is a serial operation because a current intermediate match line, such as $ML_i$, may only be pulled low when all of the intermediate match lines to the left of the current intermediate match line evaluate low to indicate a match. Likewise, the subsequent intermediate match line $ML_{i+1}$ may only be pulled low if the current intermediate match line $ML_i$ evaluates low. That is, if one intermediate match line indicates a mismatch, the subsequent match lines (the intermediate match lines to the right of the one intermediate match line) are not pulled low. More specifically, a subsequent intermediate match line, such as $ML_{i+1}$, may only be pulled low when the all of the previous intermediate match lines evaluate low to indicate a match.

Furthermore, in the static NAND TCAM, in contrast to the dynamic NAND TCAM, because the match line output $ML_{NAND}$ is connected to the serial PMOS transistors (e.g., first PMOS transistor 512 and second PMOS transistor 514), the $ML_{NAND}$ value is not a float value when there is a mismatch, rather, the serial PMOS transistors pull the match line output $ML_{NAND}$ high to indicate the mismatch. Moreover, the intermediate match lines are serially connected and the state of the match line output $ML_{NAND}$ is not known until all the match lines are evaluated or until a mismatch is determined. Therefore, as shown in TABLE 3, in cases when the output is not yet known, the match line output $ML_{NAND}$ will be either 0/1 when a mismatch has not yet been determined.

Furthermore, as shown in TABLE 3, a propagation from a current intermediate match line $ML_i$ to a subsequent intermediate match line $ML_{i+1}$ ($ML_i \rightarrow ML_{i+1}$ propagation) may activate (ON) when either the XNOR is 1 or the mask bit (M) is 0. That is, when the XNOR is 1, a key NMOS transistor 502 is activated and pulls the current intermediate match line $ML_i$ low to indicate a match. Alternatively, when the mask bit (M) is 0, the mask bit bar (M#) of the mask cell will be 1 and a mask NMOS transistor 504 is activated and pulls the current intermediate match line $ML_i$ low to indicate a match. As shown in TABLE 3, when the mask bit is 0, the state of the other variables is X because the current intermediate will pull low to indicate a match regardless of the other values, such as the State, the Key Bit, and the Search Line. More specifically, the state of X is a "don't care" state, which refers to a mask state in which there is neither a match nor a mismatch, rather, there is no comparison between the value of the search line and the values key cell.

Additionally, a mismatch is indicated when the XNOR is 0 and the mask bit (M) is 1. Although not shown in TABLE 3, the mask bit bar (M#) is 0 when the mask bit is 1 and vice versa. That is, when XNOR is 0 the XNOR line ($XNOR_0$-$XNOR_{n-1}$) is also 0. Furthermore, when the mask bit bar is 0 (e.g., mask bit is 1), the mask bit bar line ($M_0\#$-$M_{n-1}\#$) is 0. Thus, when both the XNOR line and the mask bit bar line are 0, the first PMOS transistor 512 and second PMOS transistor 514 are enabled and set the match line output ($ML_{NAND}$) to high. As previously discussed, a mismatch is indicated when the match line is high.

Finally, in TABLE 3, the state refers to the state of a storage element (key cell and mask cell). The state is 0 when the key cell has a value of 0; the state is 1 when the key cell has a value of 1; and the state is X when the mask cell is 0. That is, for the state of X, when the mask cell is 0, the mask NMOS transistor 504 is enabled and pulls the intermediate match line to low regardless of the XNOR value.

Figure 6:
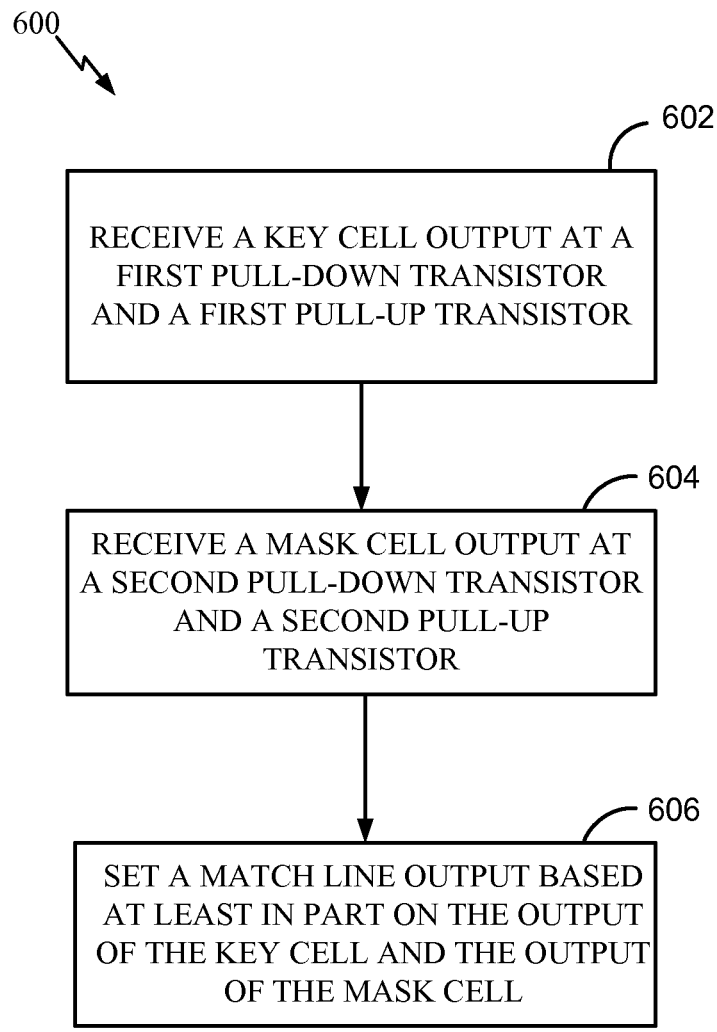
FIG. 6 illustrates a block diagram for a method according to an aspect of the present disclosure.

FIG. 6 illustrates a block diagram of a method 600 within a TCAM. As illustrated in FIG. 6, in block 602, a key cell output is received at a first pull-down transistor and a first pull-up transistor. In block 604, a mask cell output is received at a second pull-down transistor and a second pull-up transistor. Furthermore, in block 606, a match line output is set based on the output of the key cell and/or the output of the mask cell.

Figure 7:
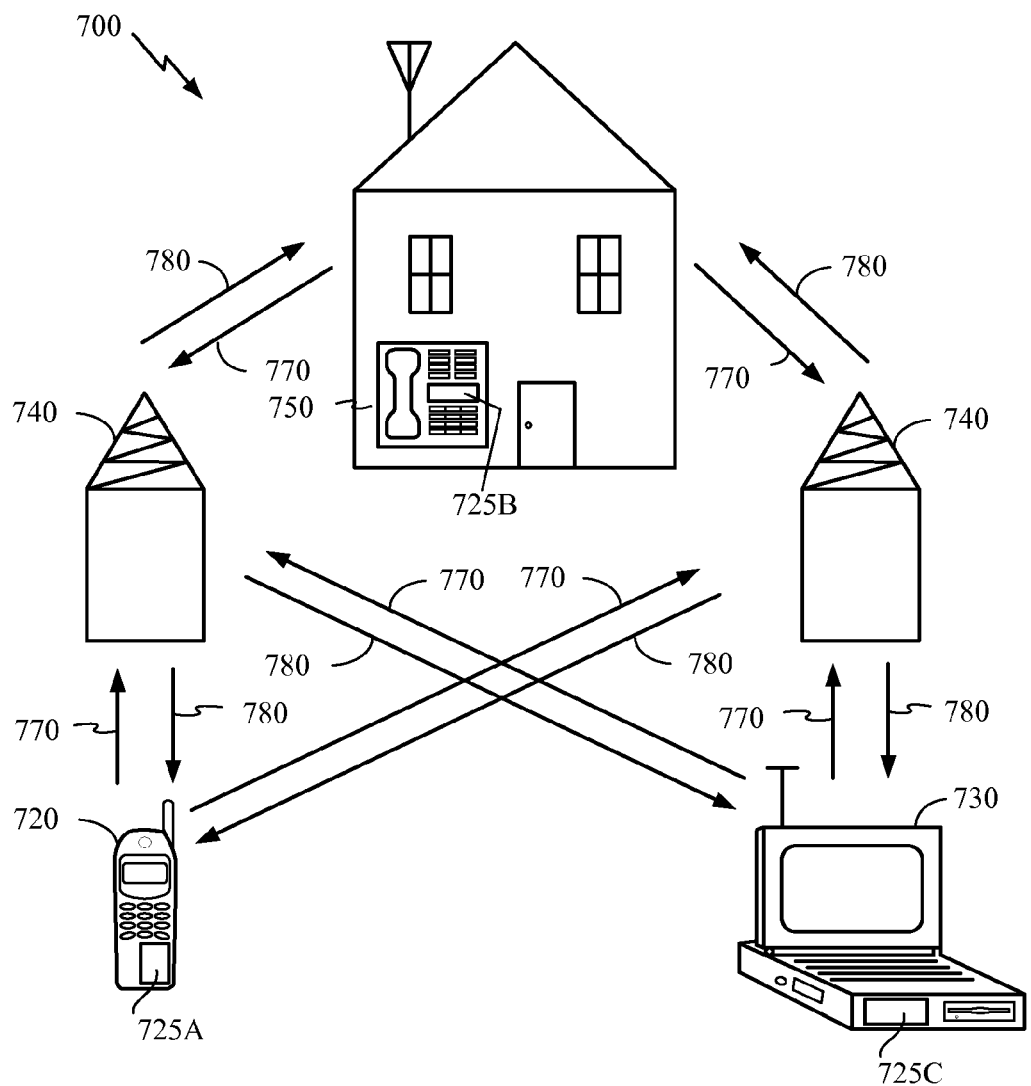
FIG. 7 illustrates an exemplary wireless communication system in which a configuration of the disclosure may be advantageously employed.

FIG. 7 shows an exemplary wireless communication system 700 in which an embodiment of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include multi-core processors with a static NAND TCAM 725A, 725B, and 725C. FIG. 7 shows forward link signals 770 from the base stations 740 and the remote units 720, 730, and 750 and reverse link signals 780 from the remote units 720, 730, and 750 to base stations 740.

In FIG. 7, the remote unit 720 is shown as a mobile telephone, remote unit 730 is shown as a portable computer, and remote unit 750 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 7 illustrates remote units, which may employ multi-core processors with the static NAND TCAM 725A, 725B, and 725C according to the teachings of the disclosure, the disclosure is not limited to these exemplary illustrated units. For instance, multi-core processors with the static NAND TCAM according to aspects of the present disclosure may be suitably employed in any device.

Figure 8:
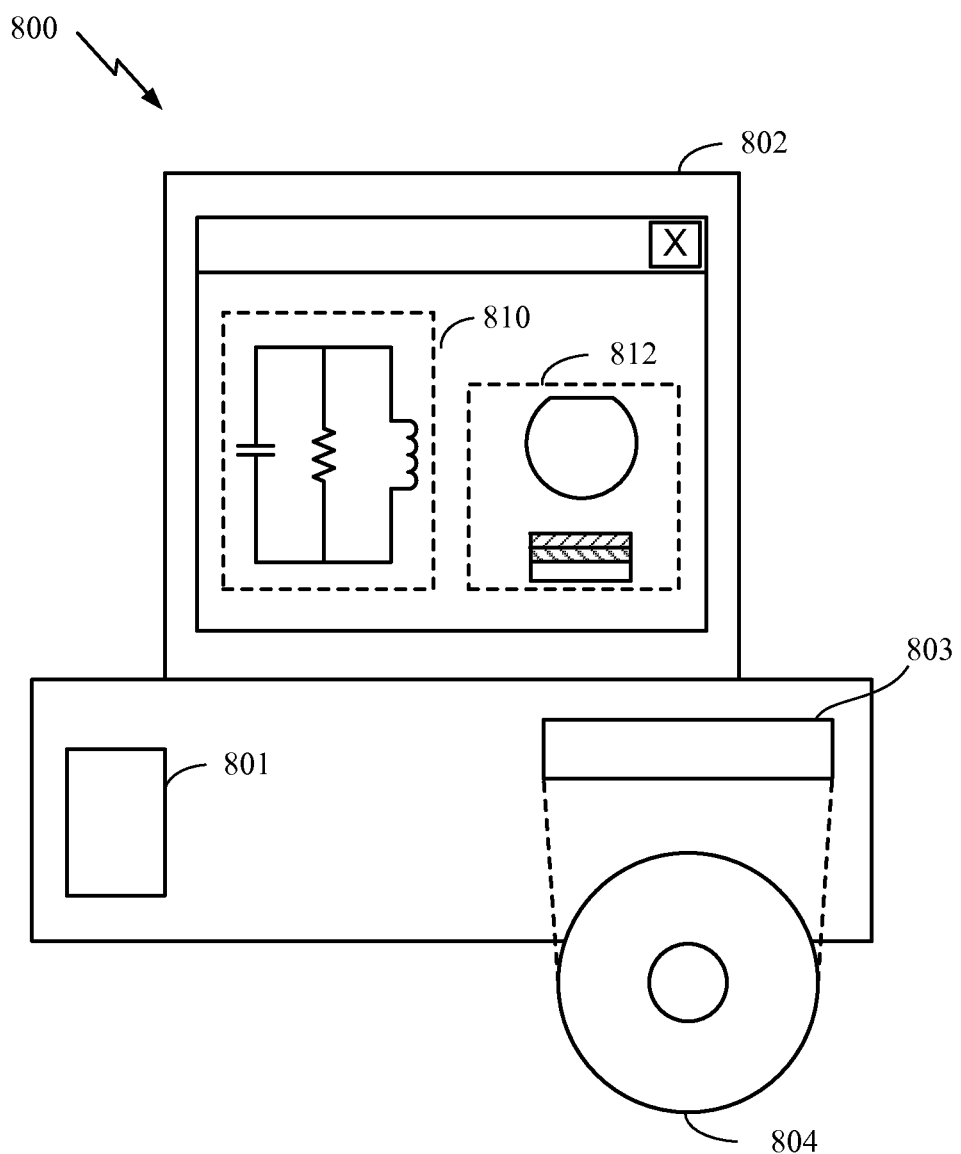
FIG. 8 is a block diagram illustrating a design workstation used for circuit, layout, and logic design of a semiconductor component according to one aspect of the present disclosure.

FIG. 8 is a block diagram illustrating a design workstation used for circuit, layout, and logic design of a semiconductor component, such as the multi-core processor with the static NAND TCAM disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as the static NAND TCAM. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

In one configuration, the TCAM includes receiving means and a setting means. The receiving means and setting means may be the key cells, bit cells, intermediate match lines, match line output, parallel pull-up transistors, and/or serial pull-down transistors configured to perform the functions recited by the storage means.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A static, ternary content addressable memory (TCAM), comprising:
   a first means for generating a comparison output based on a comparison of a search bit to a key bit, wherein a first pull-down transistor conducts and a first pull-up transistor does not conduct in response to the comparison output indicating a match between the search bit and the key bit, and wherein the first pull-down transistor does not conduct and the first pull-up transistor conducts in response to the comparison output indicating a mismatch between the search bit and the key bit;
   a second means for generating a mask output, wherein a second pull-down transistor conducts and a second pull-up transistor does not conduct in response to the mask output being asserted, and wherein the second pull-down transistor does not conduct and the second pull-up transistor conducts in response to the mask output being de-asserted, the first pull-down transistor and the second pull-down transistor being connected in parallel between a match line output and a first supply voltage terminal, and the first pull-up transistor and the second pull-up transistor being connected in series between a second supply voltage terminal and the match line output.

2. The TCAM of claim 1, in which the second means is a static random access memory (SRAM) bit cell.

3. The TCAM of claim 1, in which the first means includes a static random access memory (SRAM) cell and XNOR logic, wherein an output of the XNOR is configured to generate the comparison output.

4. The TCAM of claim 3, wherein the output of the XNOR logic is coupled to the first pull-down transistor and the first pull-up transistor.

5. The TCAM of claim 1, further comprising a search line input for receiving the search bit by the first means.

6. The TCAM of claim 1, further comprising an intermediate match line coupled to the first pull-down transistor and the second pull-down transistor.

* * * * *